(12) United States Patent
Ngo et al.

(10) Patent No.: US 9,252,115 B1
(45) Date of Patent: Feb. 2, 2016

(54) METHOD FOR FORMING SEMICONDUCTOR LAYOUT

(71) Applicant: Marvell International Ltd., Hamilton (BM)

(72) Inventors: Thomas Ngo, Saratoga, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/331,624

(22) Filed: Jul. 15, 2014

Related U.S. Application Data

(62) Division of application No. 12/020,856, filed on Jan. 28, 2008, now Pat. No. 8,796,868.

(60) Provisional application No. 60/887,247, filed on Jan. 30, 2007.

(51) Int. Cl.
*H01L 21/44* (2006.01)
*H01L 21/48* (2006.01)
*H01L 23/00* (2006.01)
*H01L 21/768* (2006.01)

(52) U.S. Cl.
CPC .............. *H01L 24/19* (2013.01); *H01L 21/768* (2013.01); *H01L 21/76895* (2013.01); *H01L 24/03* (2013.01); *H01L 24/11* (2013.01); *H01L 2224/033* (2013.01)

(58) Field of Classification Search
CPC ......... H01L 24/11; H01L 24/05; H01L 24/06; H01L 24/10; H01L 24/49; H01L 21/768; H01L 24/19; H01L 24/03; H01L 21/76895; H01L 2224/033
USPC .......... 438/612, 617, 108, 614, 958; 257/786, 257/780, 737, 666, 779, 784, E23.151, 257/E23.146, E23.02
See application file for complete search history.

(56) References Cited

U.S. PATENT DOCUMENTS

| | | | |
|---|---|---|---|
| 6,064,115 A | 5/2000 | Moscicki | |
| 6,577,008 B2 | 6/2003 | Lam et al. | |
| 7,288,846 B2 | 10/2007 | Sasaki | |
| 7,319,277 B2 | 1/2008 | Lin | |
| 7,601,628 B2 | 10/2009 | Daubenspeck et al. | |
| 2002/0109232 A1* | 8/2002 | Lin et al. | 257/758 |
| 2005/0253259 A1 | 11/2005 | Lin et al. | |
| 2006/0226542 A1* | 10/2006 | Chien et al. | 257/737 |
| 2007/0079200 A1 | 4/2007 | Tabatabaei et al. | |
| 2008/0042275 A1* | 2/2008 | Kuan et al. | 257/738 |

* cited by examiner

*Primary Examiner* — Shouxiang Hu

(57) ABSTRACT

Apparatuses and methods for an improved semiconductor layout are described herein. Embodiments of the present invention provide a microelectronic device including a microelectronic die and one or more redistribution paths formed thereon for electrically interconnecting at least one bond pad with an exposed portion of the redistribution path. The redistribution paths, bond pads, and exposed portions may be configured to result in the device having a width narrowed by at least the width of the bond pads due to their absence on at least one edge.

8 Claims, 4 Drawing Sheets

METHOD FOR FORMING SEMICONDUCTOR LAYOUT

CROSS-REFERENCE TO RELATED APPLICATIONS

The present disclosure is a divisional of and claims priority to U.S. patent application Ser. No. 12/020,856, filed Jan. 28, 2008, now U.S. Pat. No. 8,796,868, issued Aug. 5, 2014, 2014, which claims priority to U.S. Provisional Patent Application No. 60/887,247, filed Jan. 30, 2007, which are incorporated herein by reference.

TECHNICAL FIELD

Embodiments of the present invention relate to the field of microelectronics, in particular, to microelectronic devices and packages.

BACKGROUND

In the current state of integrated circuit technology, an integrated circuit device will often be in the form of a chip. Such a chip will sometimes be mounted onto a leadframe or carrier substrate for forming a package. Bond pads located on the chip may be used for electrically interconnecting the chip with the leadframe/carrier substrate. The bond pad structures, however, generally consume a fair amount of space. Resultantly, the size and cost of a package incorporating the chip, as well as on the system level board, may also be affected. In the drive to provide increasingly smaller device and product sizes, reducing the spacing impact of these devices is of substantial importance.

SUMMARY OF THE INVENTION

In view of the problems in the state of the art, embodiments of the invention are directed to an improved semiconductor layout. More specifically, with the foregoing and other items in view, there is provided, in accordance with various embodiments of the invention, a microelectronic device comprising a microelectronic die; a metal layer formed over the die; a passivation layer formed over the metal layer; at least one bond pad disposed at a first location of the device; at least one opening in the passivation layer, the at least one opening disposed at a second location of the device and exposing at least one portion of the metal layer; and one or more redistribution paths formed from the metal layer for electrically interconnecting the at least one bond pad with the exposed at least one portion of the metal layer.

In various embodiments, the at least one bond pad may comprise a wire bond pad or may be configured to couple to a solder ball. In some embodiments, the at least one bond pad may be configured to provide input/output access to the die.

In some embodiments, the metal layer for forming the redistribution paths may comprise aluminum. The one or more redistribution paths may be configured to provide input/output access to the die via the at least one bond pad.

In various embodiments, the die may have a first width and may include a core having a second width, the first width being substantially equal to the second width. In some exemplary embodiments, the at least one bond pad may comprise a plurality of bond pads disposed on opposing parallel first edges of the device, and the at least one opening may comprise a plurality of openings disposed on opposing parallel second edges of the device.

A microelectronic package is also described, suitable to solve the problems which at least one embodiment of the invention is based on, with a support structure; and a microelectronic device mounted onto the support structure. The microelectronic device may comprise a device similar to one described above.

In various embodiments, the support structure may comprise a leadframe including a plurality of bonding fingers. In various ones of these embodiments, the at least one bond pad may comprise at least one wire bond pad, and the at least one wire bond pad and the exposed at least one portion of the metal layer may be electrically interconnected with the plurality of bonding fingers.

In some embodiments, the support structure may comprise a carrier substrate including a plurality of land pads. In various ones of these embodiments, the at least one bond pad and the exposed at least one portion of the metal layer may be electrically interconnected with the plurality of land pads.

Various methods may be suitable for making microelectronic device and packages as described herein. In an embodiment, a method may comprise forming a redistribution path over a microelectronic die from a first location to a second location; forming a bond pad at the first location of the device; forming a passivation layer over the redistribution path; and forming an opening in the passivation layer at the second location of the device to expose a portion of the redistribution path.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to reduced form factor microelectronic devices and reduced form factor microelectronic packages incorporating such devices.

A microelectronic device in accordance with some embodiments comprises a microelectronic die and one or more redistribution paths formed thereon for electrically interconnecting an exposed portion of the redistribution path with at least one bond pad. In some embodiments, the device may include bond pads on one or both of opposing parallel first edges of the device and may include exposed redistribution portions on one or both of opposing parallel second edges of the device, and such a configuration may result in the device having a width narrowed by at least the width of the bond pads due to their absence on at least one edge.

Figure 1:
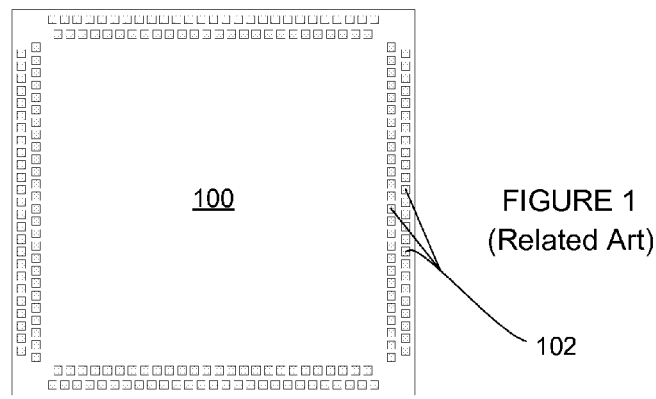
FIG. 1 illustrates a top view of a related art microelectronic device including bond pads along four edges of the device.
Figure 2:
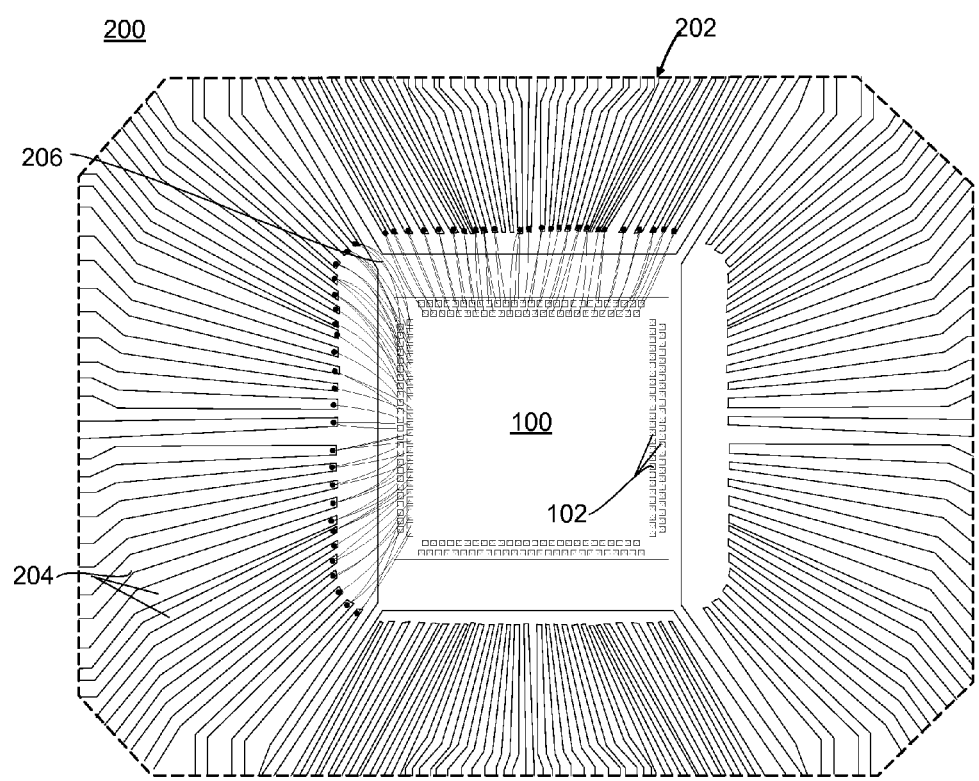
FIG. 2 illustrates a cutaway top view of a microelectronic package incorporating the microelectronic device of FIG. 1.

Illustrated in FIG. 1 and FIG. 2 is an example of a related art microelectronic device 100 including bond pads 102 on all four edges of device 100. Device 100 may be mounted onto a leadframe 202 and electrically interconnected with the bonding fingers 204 for forming the pin-out of a package 200 into which device 100 may be incorporated. As illustrated, device 100 is interconnected with bonding fingers 204 by way of wires 206. It should be noted that wires 206 are illustrated only on two sides of device 100 and encapsulation/molding material is omitted for the sake of clarity. In general, wires 206 would usually be disposed on all four sides of device 100, and some sort of encapsulation/molding material would be present for forming package 200.

Figure 3:
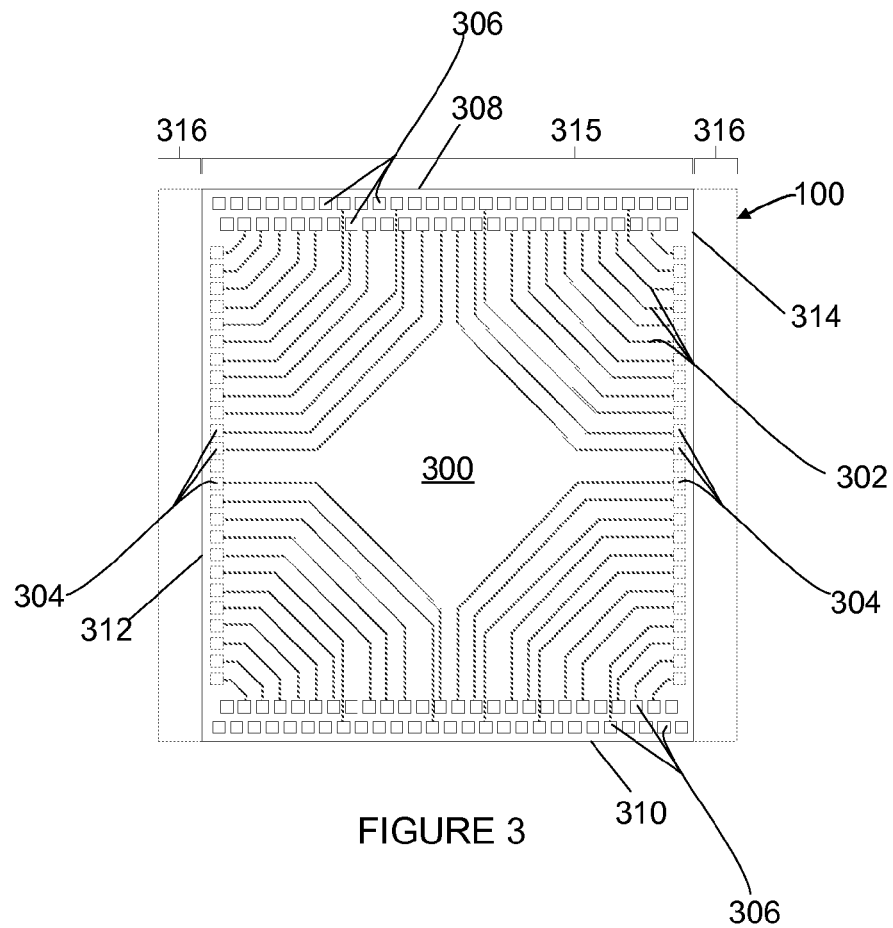
FIG. 3 illustrates a cutaway top view of another microelectronic device in accordance with various embodiments of the present invention.

In contrast to device 100 of FIG. 1 and FIG. 2, FIG. 3 illustrates an exemplary embodiment of a microelectronic device 300 wherein bond pads are eliminated on at least one side, resulting in a narrower device 300 relative to device 100 (shown in phantom in FIG. 3). In place of the eliminated bond pads are one or more redistribution paths 302, with redistribution paths 302 including openings 304 for coupling with a support structure such as, for example, a leadframe. Redistribution paths 302 electrically interconnect the exposed portion of the redistribution path 302 (exposed by way of openings 304) with at least one bond pad 306.

As illustrated, device 300 includes bond pads 306 on a top edge 308 and a bottom edge 310. On left edge 312 and right edge 314 are openings 304 exposing portions of redistribution paths 302. As can be seen, device 300 has a width 315, which is narrower than device 100 by at least twice the width 316 of the eliminated bond pads. As can be further seen, the top edge 308 and the bottom edge 310 are disposed opposite to one another, the left edge 312 and the right edge 314 are disposed opposite to one another, and the top edge 308 and the bottom edge 310 are substantially perpendicular to the left edge 312 and the right edge 314.

Although the illustrated embodiment depicts bond pads 306 being on two edges (308, 310) of device 300 and openings 304 being on the other two edges (312, 314) of device 300, other embodiments are possible. For example, bond pads 306 may be limited to a single edge of device 300, allowing for further size reduction of device 300 by at least the width of bond pads 306 on the side from which bond pads 306 are eliminated. In the exemplary embodiment, openings 304 may be disposed on the edge from which bond pads 306 are eliminated to allow for electrical interconnection with remaining bond pads 306.

In still further embodiments, bond pads 306 may be eliminated from only one edge, with openings 304 on the edge from which bond pads 306 are eliminated. Although this embodiment may achieve less size reduction relative to the foregoing embodiments, some size reduction would still be realized relative to device 100 of FIG. 1 and FIG. 2.

Openings 304 are not necessarily limited to being formed on the edges of device 300. For example, openings 304 may be disposed in various locations on device 300 including a generally center portion of device 300. In general, however, it may be more desirable to locate openings 304 along the edges to limit the span of wires electrically interconnecting device 300 to a leadframe. In embodiments wherein device 300 is to be bonded to a carrier substrate by way of one or more solder balls, it may be desirable to locate openings 304 in more areas or in alternate areas than simply along edges of device 300. For example, openings 304 may be formed in such a manner to provide for an array of solder balls. Other configurations may be possible within the scope of the present disclosure.

Figure 4:
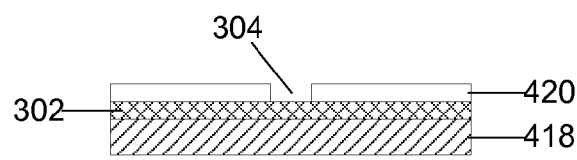
FIG. 4 illustrates cross-sectional side view of a portion of a microelectronic device in accordance with various embodiments of the present invention.

Turning now to FIG. 4, illustrated is a cross-sectional view of a portion of device 300 (e.g., as viewed from the left edge 312 or the right edge 314). In particular, a cross-section of one opening 304 of device 300 is illustrated. As illustrated, opening 304 exposes a portion of the redistribution path 302 formed over the die 418.

Die 418 may be any integrated circuit device and may depend on the application. In various embodiments, die 418 may have a width substantially equal to width 315 of device 300. Further, in some embodiments, die 418 may include a core having a width substantially equal to width of die 418. Accordingly, device 300 may advantageously allow for reduction of the device 300 size to substantially the core size.

Redistribution paths 302 may comprise any material suitable for the transmission of signals and/or power/ground. For example, in some embodiments, redistribution paths 302 may comprise a metal layer. Aluminum may be suitable for various applications. Other metals may be similarly suitable. For example, any one or more of copper, nickel, gold, palladium, and silver may be suitable, depending on the particular application. Redistribution paths 302 may be formed during normal die processing according to conventional techniques so that an additional processing operation(s) may be avoided. In various other embodiments, redistribution paths 302 may be formed subsequent to normal die processing, which may include the formation of one or more metal layers, using an additional metal layer.

Opening 304 may be formed in any suitable material including, for example, a passivation layer 420 (omitted from FIG. 3 for the sake of clarity). Passivation layer 420 may be formed directly over various surfaces of microelectronic device 300 such as, for example, redistribution paths 302. In an embodiment, the passivation layer 420 may be formed over the metal layer. The opening 304 of the passivation layer 420 exposes a portion of the metal layer. Each of the exposed portions of the metal layer is positioned along an edge of die 418. Passivation layer 420 may comprise any material suitable for the purpose, including, for example, oxide, nitride, polyimide, or oxynitride.

Bond pads 306 may be any bond pad configured to provide access to die 418. Bond pads 306 may provide, for example, input/output access to die 418. Any one or more of various signals may be provided to and/or output from die 418 by way of bond pads 306. One or more of bond pads 306 may be configured for providing power and ground to die 418. As redistribution paths 302 are electrically interconnected with bond pads 306, redistribution paths 302 may accordingly be configured to provide input/output access to the die 418 via the at least one bond pad 306.

In some embodiments, exposed portions of redistribution paths 302 may be used for certain types of signals, while bond pads 306 are used for other types of signals. In the illustrated embodiment, for example, redistribution path 302 increases the overall travel distance for signals between the signal source and die 418 by at least the length of redistribution path 302. This increased distance may add a time delay to the signals. Accordingly, in some embodiments, it may be desirable to use the exposed portion of redistribution paths 302 for test purposes. For example, the redistribution paths 302 may be used for test pins. For example, redistribution paths 302 may be used for Joint Test Action Group (JTAG) interfacing in accordance, e.g., with IEEE standard 1149.1-2001, published Jun. 14, 2001, along with any revisions, amendments, or updates thereto. Additionally or alternatively, redistribution paths 302 may be used for other applications in which any delay may be of minimal criticality including, for example, for light-emitting diodes (LEDs).

In some embodiments, bond pads 306 may comprise wire bond pads configured to electrically interconnect to a support structure (e.g., a leadframe or carrier substrate) or to another microelectronic device by way of wires.

In various embodiments, bond pads 306 may be configured to couple to a solder ball or similar interconnect material. With such a configuration, device 300 may be coupled to a carrier substrate by reflowing the solder balls, physically and electrically coupling device 300 with the carrier substrate. In various ones of these embodiments, an under-ball metallization and/or solder-associated structures may be provided as desired. Under-ball metallization may be adapted to serve any one or more purposes including to support an interconnect material until adhesion is achieved (e.g., via reflow operations), provide a surface that is more readily adhered to by the interconnect material than bond pad 306, or prevent diffusion of various components of the interconnect material to microelectronic device 300. Under-ball metallization may comprise any material known in the art including, for example, chromium, copper, gold, nickel, or alloys thereof.

Figure 5:
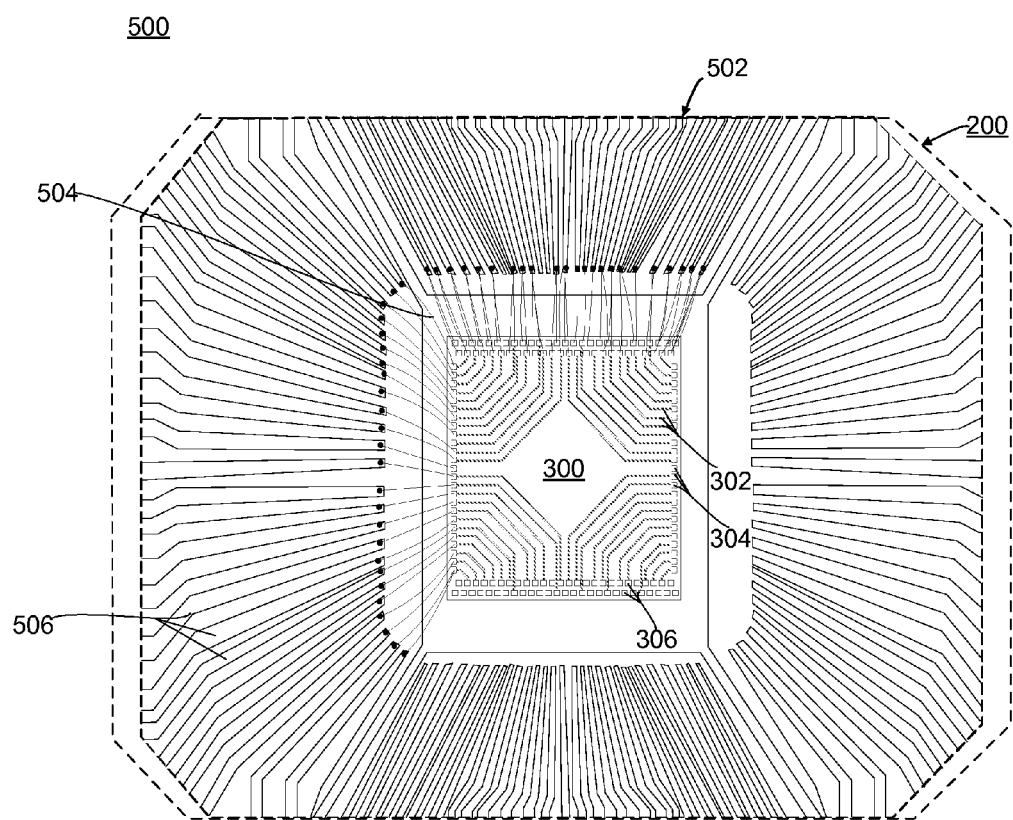
FIG. 5 illustrates a cutaway top view of a microelectronic package incorporating the microelectronic device of FIG. 3 in accordance with various embodiments of the present invention.

As described briefly above, device 300 may be mounted onto a support structure. As illustrated in FIG. 5, for example, device 300 is integrated into a microelectronic package 500 including a leadframe 502. It should be noted that the illustrated package 500 omits some features conventionally found in packages for the sake of clarity. For example, a package generally includes an encapsulation material or the like for encapsulating at least device 300. In addition, wires 504 are depicted on only two sides of device 300, for the sake of clarity, although wires 504 usually would be located on all four sides of device 300 in such a leadframe-based package 500.

Leadframe 502 may include a plurality of bonding fingers 506 (sometimes referred to in the art as "lead fingers"). Bonding fingers 506 may form the pin-out of package 500, either directly or via, for example, external leads or bond pads (not shown). The pins may be configured to interconnect package 500 to one or more of signals, ground, and power, depending on the application.

Device 300 may be electrically interconnected with bonding fingers 506 via wires 504. More specifically, bond pads 306 and exposed portions of redistribution paths by way of openings 304 may be coupled to wires 504, which in turn are coupled to bonding fingers 506.

Due to the reduced width of device 300, overall width of the package 500 may be similarly reduced relative to package 200 of FIG. 2, for example, as depicted in phantom for reference.

According to various embodiments, microelectronic package 500 may include a protective housing enclosing at least device 300. The protective housing may comprise an encapsulant material, such as an epoxy or polymeric material, which may be molded over part or all components of microelectronic package 500 as desired. In various other embodiments, a pre-molded cavity such as, for example, a metal can, a ceramic cavity, or a plastic cavity, may be enlisted, depending on the application.

Microelectronic package 500 may be a leaded or leadless package, depending on the application. For example, exemplary packages include, but are not limited to, quad flat packages, leadless quad flat packages, thin quad flat packages, quad flat no-lead packages, and thin small outline packages.

Figure 6:
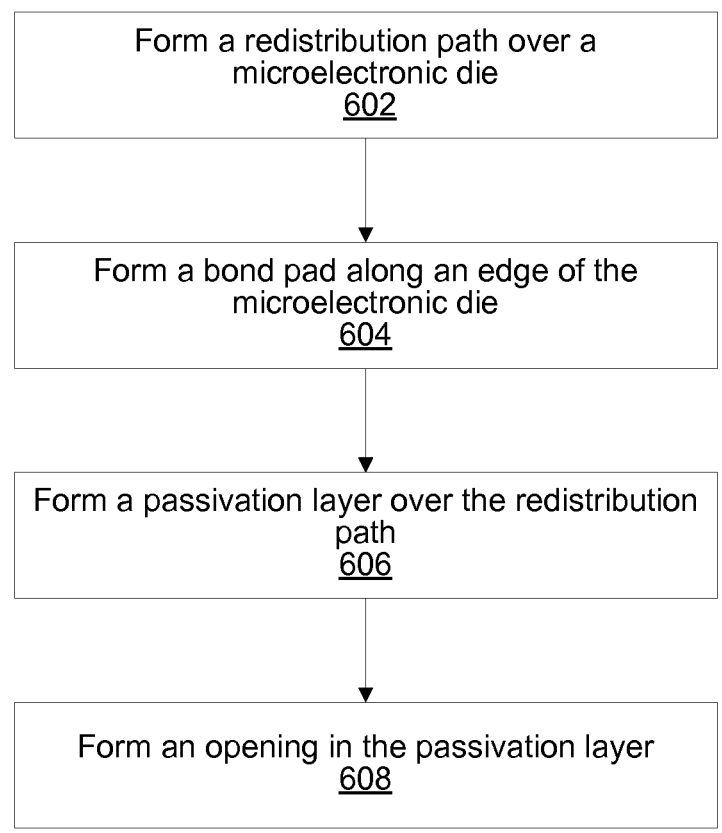
FIG. 6 illustrates a flow diagram view of a portion of the operations associated with making a microelectronic device in accordance with various embodiments of the present invention.

Turning now to FIG. 6, illustrated is a flow diagram of a portion of the operations associated with making a microelectronic device in accordance with various embodiments described herein.

According to various embodiments, a redistribution path may be formed at block 602. The redistribution path may be formed over a microelectronic die and may be formed from at least a first location to at least a second location. In various embodiments, the redistribution path may be configured to electrically interconnect with at least one bond pad. As noted herein, a redistribution path may be formed during normal die processing according to conventional techniques so that an additional processing operation(s) may be avoided. In some embodiments, a redistribution path may be formed during an operation separate from normal die processing.

A bond pad may be formed at block 604 at the first location. In an embodiment, the first location may be an edge of the microelectronic die. The bond pad may be configured to provide input/output access to the die. In various embodiments, forming the bond pad may comprise forming a wire bond pad. Alternatively, forming the bond pad may comprise forming a bond pad configured to couple to a solder ball. In such embodiments, the method may further comprise coupling a solder ball with the bond pad.

A passivation layer may be formed at block 606 over the redistribution path. An opening may be formed in the passivation layer at block 608. The opening may be located at the second location of the device to expose a portion of the redistribution path.

In various embodiments, the method may further comprise various operations associated with forming a microelectronic package. For example, the method may further comprise mounting the microelectronic device onto a support structure such as a leadframe or a carrier substrate. Electrical interconnections may be formed between the device and the support structure for forming a pin-out. Encapsulation or a similar operation may be performed for protecting the device. The method may comprise various other operations depending on the application.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   forming a plurality of redistribution paths on a die;
   forming a passivation layer on the plurality of redistribution paths;
   forming a plurality of openings in the passivation layer, wherein each opening of the plurality of openings in the passivation layer exposes a corresponding portion of a corresponding redistribution path of the plurality of redistribution paths, wherein the plurality of openings in the passivation layer includes a first opening in the passivation layer, wherein the first opening in the passivation layer exposes a portion of a first redistribution path of the plurality of redistribution paths;
   forming a plurality of bond pads on the die, wherein the plurality of bond pads includes a first bond pad on the die, wherein the first redistribution path is coupled to the first bond pad, wherein the first bond pad provides an input/output access to the die and the first opening does not provide any direct input/output access to the die; and
   electrically interconnecting the portion of the first redistribution path, through the first opening, to a first bonding finger of a plurality of bonding fingers of a leadframe via a first wire, wherein the first bonding finger is electrically coupled to an internal circuit of the die via (i) the first wire, (ii) the first redistribution path, and (iii) the first bond pad,
   wherein each opening of the plurality of openings in the passivation layer is formed near a first edge of the die,
   wherein each bond pad of the plurality of bond pads is formed near a second edge of the die that is perpendicular to the first edge of the die, and
   wherein no bond pad is formed near the first edge of the die.

2. The method of claim 1, further comprising:
   electrically interconnecting the first bond pad to a second bonding finger of the plurality of bonding fingers of the leadframe via a second wire.

3. The method of claim 1, wherein:
   each opening of the plurality of openings in the passivation layer is electrically coupled, via the corresponding redistribution path of the plurality of redistribution paths, to a corresponding bond pad of the plurality of bond pads.

4. The method of claim 1, wherein forming the plurality of redistribution paths on the die comprises:
   forming a metal layer on the die; and
   forming the plurality of redistribution paths from the metal layer formed on the die.

5. The apparatus of claim 4, wherein the metal layer comprises aluminum.

6. The method of claim 1, further comprising:
   forming a second bond pad of the plurality of bond pads on the die; and
   electrically interconnecting the second bond pad to a second bonding finger of the plurality of bonding fingers of the leadframe via a second wire,
   wherein based on the first bond pad being electrically coupled to the first bonding finger via (i) the first redistribution path and (ii) the first wire, the first bond pad is configured to provide the die access to a first type of signal, and
   wherein based on the second bond pad being electrically coupled to the second bonding finger via the second wire, by bypassing any redistribution path, the second bond pad is configured to provide the die access to a second type of signal.

7. The method of claim 6, wherein the first type of signal is relatively more delay tolerant compared to the second type of signal.

8. The method of claim 6, wherein the first type of signal comprises at least one of (i) a test signal used for Joint Test Action Group (JTAG) interfacing and (ii) a signal provided to a light-emitting diode (LED).

* * * * *